(12) United States Patent
Firnkes et al.

(10) Patent No.: US 11,501,947 B1
(45) Date of Patent: Nov. 15, 2022

(54) ABERRATION CORRECTOR AND METHOD OF ALIGNING ABERRATION CORRECTOR

(71) Applicant: ICT Integrated Circuit Testing Gesellschaft für Halbleiterprüftechnik mbH, Heimstetten (DE)

(72) Inventors: Matthias Firnkes, Walpertskirchen (DE); Florian Lampersberger, Munich (DE); John Breuer, Munich (DE); Thomas Kernen, Meppen (DE); Shem Yehoyda Prazot Ofenburg, Jerusalem (IL)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 41 days.

(21) Appl. No.: 17/324,444

(22) Filed: May 19, 2021

(51) Int. Cl.
*H01J 37/153* (2006.01)

(52) U.S. Cl.
CPC ....... *H01J 37/153* (2013.01); *H01J 2237/032* (2013.01); *H01J 2237/1534* (2013.01); *H01J 2237/28* (2013.01)

(58) Field of Classification Search
CPC ............... H01J 37/153; H01J 2237/032; H01J 2237/1534; H01J 2237/28
See application file for complete search history.

(56) References Cited

U.S. PATENT DOCUMENTS 9,287,084 B2    3/2016    Cheng et al.

*Primary Examiner* — Nicole M Ippolito
*Assistant Examiner* — Hanway Chang
(74) *Attorney, Agent, or Firm* — Kilpatrick Townsend & Stockton ELP (57) ABSTRACT

Provided is an aberration corrector having a plurality of magnetic poles including a first magnetic pole and further magnetic poles, a ring that magnetically connects the plurality of magnetic poles with one another, the ring having a constant spacing to at least the first magnetic pole, a plurality of magnetic field modulators including a first magnetic field modulator and further magnetic field modulators, and a plurality of guides including a first guide and further guides; wherein the first magnetic field modulator includes a soft magnetic material, wherein the first magnetic field modulator is disposed in a first position, the first position being one of the following: adjacent to a first air gap separating the first magnetic pole and the ring, or at an inner ring surface or radially outward of the inner ring surface along an axis of the first magnetic pole, and wherein the first guide constrains the first magnetic field modulator to positions along a first axis substantially parallel to or coincident with the axis of the first magnetic pole.

20 Claims, 8 Drawing Sheets

ABERRATION CORRECTOR AND METHOD OF ALIGNING ABERRATION CORRECTOR

TECHNICAL FIELD

Embodiments described herein relate to an aberration corrector, and particularly to an aberration corrector having a plurality of magnetic poles and a ring. More specifically, embodiments described herein relate to an aberration corrector having a plurality of magnetic poles and a ring that magnetically connects the plurality of magnetic poles with one another. Embodiments further relate to a charged particle beam apparatus having an aberration corrector and a method of aligning a magnetic field of an aberration corrector.

BACKGROUND

In charged particle beam devices such as microscopes, micro-machining apparatuses, semiconductor manufacturing apparatuses and so forth, single-stage or multi-stage multipoles (dipoles, quadrupoles, hexapoles, octupoles and so forth) are used in deflectors or aberration correctors. Using the aforementioned apparatuses, machining with an accuracy of 10 micrometers or so, and observation with an accuracy in the sub-micrometer range can be performed.

For such applications, the resolution of the apparatus is beneficially in the sub-nanometer range. In aberration correctors, imperfections in the field-shaping multipole elements can lead to aberrations that limit the achievable resolution.

In particular, in aberration correctors such as spherical aberration correctors and chromatic aberration correctors, where multipole fields involved can be very strong, inaccuracies in such correctors can lead to imperfections in the electric and magnetic field profiles, which in turn generate residual aberrations that limit the attainable performance of the apparatus.

Accordingly, high accuracy in manufacturing and assembling is required. For example, accuracy in positioning of poles and other components that make up the magnetic circuit in a magnetic aberration corrector is required. This is because such positioning inaccuracies cause parasitic multipole fields which in turn cause blurring of the beam. In addition, solutions to increase accuracy often involve increasing complexity which negatively impacts reproducibility and cost, especially in mass production.

For example, patent document U.S. Pat. No. 9,287,084 B2 describes an adjustment member disposed between a magnetic pole and a magnetic ring to adjust a spacing between the pole and the ring. However, such a solution addresses only a part of the magnetic circuit. Further, additional components typically increase complexity in manufacturing and assembly, and introduce additional sources of inaccuracy. Still further, even if the system is assembled in a sufficiently good condition, such a solution does not address maintenance issues, for example, vibrations during operational lifetime leading to deterioration in the mechanical positioning of the components of the system.

Accordingly, it would be beneficial to provide an aberration corrector, and a method of aligning a magnetic field of an aberration corrector which can reliably achieve the necessary accuracy or better, and at the same time be susceptible to mass production. In particular, it would be beneficial to provide an aberration corrector and a method of aligning a magnetic field of an aberration corrector that can reliably address the various causes of inaccuracies (during manufacturing, assembly, operation etc.) that lead to reduced performance.

SUMMARY

In light of the above, an invention as defined by the independent claims is provided. According to aspects described herein, aberration correctors and a method of aligning a magnetic field of an aberration corrector are provided. Further aspects, advantages, and features of embodiments are apparent from the dependent claims, the description, and the accompanying drawings.

According to an aspect described herein, it is described an aberration corrector having a plurality of magnetic poles including a first magnetic pole and further magnetic poles, a ring that magnetically connects the plurality of magnetic poles with one another, the ring having a constant spacing to at least the first magnetic pole, a plurality of magnetic field modulators including a first magnetic field modulator and further magnetic field modulators, and a plurality of guides including a first guide and further guides; wherein the first magnetic field modulator includes a soft magnetic material, wherein the first magnetic field modulator is disposed in a first position, the first position being at least one of the following: adjacent to a first air gap separating the first magnetic pole and the ring, at an inner ring surface, radially outward of the inner ring surface along an axis of the first magnetic pole, and wherein the first guide constrains the first magnetic field modulator to positions along a first axis substantially parallel to or coincident with the axis of the first magnetic pole.

According to a further aspect, it is described an aberration corrector having a plurality of magnetic poles including a first magnetic pole and further magnetic poles, a ring that magnetically connects the plurality of magnetic poles with one another, the ring having a constant spacing to at least the first magnetic pole, a plurality of magnetic field modulators including a first magnetic field modulator and further magnetic field modulators, and a plurality of guides including a first guide and further guides; wherein the first magnetic field modulator comprises a soft magnetic material, wherein the first magnetic field modulator is disposed in a first position, and wherein the first guide constrains the first magnetic field modulator to positions along a first axis substantially parallel to or coincident with the axis of the first magnetic pole.

According to a further aspect described herein, it is described a method of aligning a magnetic field of an aberration corrector with an optical axis, the aberration corrector having a plurality of magnetic poles including a first magnetic pole and further magnetic poles, a ring that magnetically connects the plurality of magnetic poles with one another, the ring having a constant spacing to at least the first magnetic pole; and, a plurality of magnetic field modulators including a first magnetic field modulator and further magnetic field modulators, and a plurality of guides including a first guide and further guides; wherein the first magnetic field modulator includes a soft magnetic material, and wherein the first magnetic field modulator is disposed in a first position, the first position being one of the following: adjacent to a first air gap separating the first magnetic pole and the ring, or at an inner ring surface or radially outward of the inner ring surface along an axis of the first magnetic pole, the method including positioning the first magnetic field modulator in a first position, the first position being one of a plurality of positions along a first axis substantially parallel to or coincident with the axis of the first magnetic pole.

Embodiments are also directed at apparatuses for carrying out the disclosed methods and include apparatus parts for performing the individual method actions. The methods may be performed by way of hardware components, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present invention can be understood in detail, a more particular description of embodiments, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, the same reference numbers refer to the same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

To improve resolution of a charged particle beam device, such as an SEM column, beyond the limits of a simple round lens system, an aberration corrector can be used to correct aberrations. In an example, an aberration corrector is a multipole corrector. An aberration corrector can include at least one of a spherical aberration corrector, chromatic aberration corrector, coma aberration corrector and further multipole correctors. An aberration corrector can include a plurality of multipole stages. Each multipole stage may be a magnetic or electrostatic multipole or a combined magnetic/electrostatic multipole. Each multipole stage typically includes a plurality of poles.

A magnetic pole can be understood to include a pole-head 120 (close to the optical axis 109) and a rod 122 carrying an excitation coil. Pole-heads 120 may be mounted within a pole-head support 140. Pole-head support 140 may be of non-magnetic material. Rods 122 may be mounted within a rod support 142. Rod support 142 may be made of non-magnetic material. The magnetic circuit can be understood to be closed by a ring 240. A ring 240 may be understood as a magnetic yoke. The ring 240 can be understood to surround a plurality of poles with an air gap between each pole and the ring 240. The air gap may be in the order of millimetres.

According to an embodiment, an aberration corrector 101 includes two or more, such as four, stages of multipoles. According to an embodiment, an aberration corrector 101 is used to generate a magnetic quadrupole, and electric quadrupole and octupole fields. Accordingly, aberrations are corrected. Beneficially, the resolution of a charged particle beam device is improved.

As described, an aberration corrector that is aligned to an optical axis is beneficial. In particular, an aberration corrector that is aligned with an optical axis such that the tolerances are compensated is beneficial. For example, it is beneficial that tolerances arising during assembly, manufacturing and/or operation that cause misalignment of the aberration corrector with the optical axis are compensated.

Alignment of an aberration corrector can be understood as the alignment of a multipole field with the optical axis. Ideally, each pole transfers an exact amount of magnetic flux towards the optical axis. In reality, the flux depends on a number of factors including material properties, mechanical tolerances in air gaps of the magnetic circuit and mechanical tolerances of the pole head shape. Such tolerances may lead to a distorted magnetic flux distribution at the optical axis leading to a sub-optimal alignment of the aberration corrector with the optical axis.

One strategy to compensate for such tolerances is by providing auxiliary coils on each pole. However, this requires additional low-noise current sources (specifically, one additional auxiliary coil per pole) and the infrastructure to align the magnetic field of each pole. Another strategy to compensate for these tolerances is to provide a superimposed electric field. However, the additional electric correction field also provides a demand of a higher voltage budget for the power supplies. Further, the resulting ray-path is inadequate for larger tolerances. In the present disclosure, a mechanical design and a method to compensate such tolerances by mechanical means are described.

According to an aspect, it is provided an aberration corrector 101 having a plurality of magnetic poles including a first magnetic pole 210 and further magnetic poles 211, a ring 240 that magnetically connects the plurality of magnetic poles with one another, the ring 240 having a constant spacing to at least the first magnetic pole 210; a plurality of magnetic field modulators including a first magnetic field modulator 220 and further magnetic field modulators 221; and a plurality of guides including a first guide 450 and further guides (not shown).

In an example, the first guide 450 includes a surface form-fit to an external surface of the first magnetic field modulator 220. The term 'form-fit' may be understood as having a form, e.g. shape, size, cross-section dimension, that is fitting. In an example, the first guide 450 is an interface between the first magnetic field modulator 220 and the ring 240.

In an example, the first guide 450 may be understood as a hole in the ring 240 adapted for the external surface of the first magnetic field modulator 220. In a further example, the hole in the ring 240 may be provided with an internal thread adapted for an external thread on the external surface of the first magnetic field modulator 220. The further guides (not shown) may be configured according to embodiments of the first guide 450, for the further magnetic field modulators 221.

Further, according to an aspect, the first magnetic field modulator 220 includes a magnetic material, such as a soft magnetic material, the first magnetic field modulator 220 is disposed in a first position, the first position being at least one of the following: adjacent to a first air gap 230 separating the first magnetic pole 210 and the ring 240, and at an inner ring surface 241 or radially outward of the inner ring surface 241 along an axis 219 of the first magnetic pole 210, and the first guide 450 constrains the first magnetic field modulator 220 to positions along a first axis substantially parallel to or coincident with the axis 219 of the first magnetic pole 210.

In an embodiment, which can be combined with other embodiments described herein, the ring 240 has a constant spacing or distance to the first magnetic pole 210 and further magnetic poles 211.

Accordingly, by adjusting the first position of the first magnetic field modulator 220 along the first axis 429, a magnetic reluctance of the magnetic circuit of the first magnetic pole 210 is adjusted. Accordingly, a magnetic flux, and thereby a magnetic field, of the magnetic pole is modulated. In this way, a magnetic field of the aberration corrector 101 can be adjusted. Beneficially, a variety of tolerances that causes imperfections in the field are corrected or minimized.

According to an embodiment, it is provided a current source 670 adapted to drive the first magnetic pole 210 and the further magnetic poles 211. In an example, the current source 670 is adapted to drive a first excitation coil 350 of the first magnetic pole 210, and further excitation coils 351 of the further magnetic poles 211. In an example, the first magnetic pole 210 and further magnetic poles 211 are driven by the current source 670. In an example, the plurality of magnetic poles of a first multipole stage 103 of the aberration corrector 101 are driven by the current source 670.

The current source 670 may be understood as a single current source, or the same current source. In an example, the aberration corrector 101 includes a first current source driving the plurality of magnetic poles of a first multipole stage 103 of the aberration corrector 101, and a second current source driving a second plurality of magnetic poles of a second multipole stage of the aberration corrector 101. In an example, the first excitation coil 350 of the first magnetic pole 210 and further excitation coils 351 of the further magnetic poles 211 are connected in series.

In an example, the number of windings of each pole can be configured with respect to each other to provide the correction field. In an example, the plurality of magnetic poles of the aberration corrector 101 includes a first subset of poles and a second subset of poles. In an example, the first subset of poles and the second subset of poles are on a plane perpendicular to the axis of the aberration corrector 101.

In an example, each pole of the first subset of poles is on x- and y-axes perpendicular to the axis of the aberration corrector 101, the x- and y-axes being perpendicular to each other. In an example, each pole of the second subset of poles is between the x- and y-axes. In an example, the first subset of poles each have an excitation coil with N windings. In an example, the second subset of poles each have an excitation coil with N/2 windings.

Accordingly, a quadrupole field for aberration correction can be provided with a single current source 670. Accordingly, when a current source 670 drives the first magnetic pole 210 and further magnetic poles 211, electrical noise of the first magnetic pole 210 and of the further magnetic poles 211 are correlated with each other and cancel each other out. Accordingly, uncorrelated noise in the poles leading to dipole deflection fields is avoided. Beneficially, unwanted dipole fields are avoided and only the desired multipole field, e.g. quadrupole or octupole field or higher order field is provided.

According to an embodiment, the first guide includes a first actuator (not shown). In an example, the further guides include further actuators. In an example, each of the further guides includes a respective actuator. In an example, the first guide includes an actuator coupled to a screw mechanism and/or a linear guide. A screw mechanism may be a lead screw, ball screw, roller screw or screw jack. A linear guide may include at least one of a rod, rail, slide, linear bearing, linear housing, linear groove, and linear recess.

In an example, the first guide includes a screw mechanism and/or a linear guide (not shown). In an example, the first magnetic field modulator 220 is positioned by an actuator. An actuator may be at least one of a piezoelectric actuator, electric motor, cam mechanism or comb-drive. In another example, the first magnetic field modulator 220 is positioned manually (without an actuator).

Accordingly, the first position of the first magnetic field modulator 220 can be iteratively determined in an efficient and reproducible manner. Beneficially, misalignment of the aberration corrector is easily compensated and the field imperfections easily corrected or minimized.

According to an embodiment, the first position of the first magnetic field modulator 220 is (determined) based on a measurement of a magnetic field at a location substantially at an optical axis 109. The magnetic field at the optical axis 109 may be understood as a magnetic field of the first magnetic pole 210 and the further magnetic poles 211 of the aberration corrector 101. In an example, the magnetic field is a quadrupole field. In an example, the magnetic field is of a first multipole stage 103 of the aberration corrector 101.

In an example, the first position is where parasitic multipole field(s) is minimum or substantially zero. In an example, parasitic multipole field(s) is determined based on the measurement of the magnetic field at the location substantially at the optical axis 109. In an example, the first position of the first magnetic field modulator 220 and positions of the further magnetic field modulator may be where parasitic multipole field(s) measured at a position substantially at the optical axis 109 is minimum or substantially zero.

In an example, the measurement of the magnetic field at the location substantially at the optical axis 109 is made by arranging a rotating magnetic field sensor at the location substantially at the optical axis 109. In an example, the measurement of the magnetic field may be a function of angle. In an example, the measurement of the magnetic field may be a function of a rotation angle of the magnetic field sensor. Accordingly, the measurement of the magnetic field is correlated with respect to the plurality of magnetic poles. For example, based on a continuous Fourier analysis of the magnetic field vs. angle, parasitic multipole fields, e.g.

dipole, hexapole and octupole, are identified and compensated by adjusting a position of the first magnetic field modulator 220 and/or positions of the further magnetic field modulators 221.

Accordingly, the first position of the first magnetic field modulator 220 and/or positions of the further magnetic field modulators 221 may be determined without requiring each pole to be individually excited. Accordingly, no special excitation arrangement is needed and the same excitation arrangement can be used for both alignment and operation of the aberration corrector 101. Beneficially, misalignment of the aberration corrector is easily compensated and field imperfections easily corrected or minimized.

According to an embodiment, the first magnetic pole 210, the first magnetic field modulator 220 and the ring 240 are supported such that the first position of the first magnetic field modulator 220 is independent of a first distance between the first magnetic pole 210 and the ring 240.

In an example, the first magnetic pole 210, the first magnetic field modulator 220 and the ring 240 are supported by a housing (and/or by separate elements) of the aberration corrector 101. In another example, the first magnetic pole 210 and the ring 240 are supported by a housing (and/or by separate elements) of the aberration corrector 101, and the first magnetic field modulator 220 is supported by the ring 240. Accordingly, the first position of the first magnetic field modulator 220 may be independent of the first distance between the first magnetic pole 210 and the ring 240.

Accordingly, the first position of the first magnetic field modulator 220 can be adjusted independent of the first distance between the first magnetic pole 210 and the ring 240. Accordingly, magnetic reluctance can be easily adjusted and field imperfections easily corrected or minimized.

According to an embodiment, a second magnetic field modulator of the plurality of magnetic field modulators, a second magnetic pole of the plurality of magnetic poles and the ring 240 may be supported such that a second position of the second magnetic field modulator is independent of a second distance between the second magnetic pole and the ring 240.

According to an embodiment, each of the plurality of magnetic field modulators, each of the plurality of magnetic poles and the ring 240 may be supported such that a position of each of the magnetic field modulators is independent of a respective distance between each of the plurality of magnetic poles and the ring 240.

Accordingly, precise (well-controlled, pole specific) alignment of the magnetic field of the aberration corrector 101 is possible. Accordingly, the magnetic poles of the aberration corrector 101 can be aligned in a straightforward manner. Beneficially, misalignment of the aberration corrector is easily compensated and field imperfections easily corrected or minimized.

According to an embodiment, the first magnetic field modulator 220 is disposed in a plane substantially parallel to a plane of the plurality of magnetic poles. In an example, an axis 429 of the first magnetic field modulator 220 is parallel to an axis 219 of the first magnetic pole 210. In an example, the first magnetic field modulator 220 is disposed above or below the first air gap 230 and/or the first magnetic pole 210.

In an example, the first magnetic field modulator 220 is separated, e.g. by a finite distance, from the first air gap 230 and/or the first magnetic pole 210 in a direction parallel to an axis of the aberration corrector 101. In an example, the first magnetic field modulator 220 is disposed adjacent to the first air gap 230 and/or the first magnetic pole 210 in a direction parallel to an axis of the aberration corrector 101.

Accordingly, the sensitivity of change of magnetic reluctance and thus magnetic flux with respect to change of position of the magnetic field modulators is reduced. Accordingly, the system is easier to align and less sensitive to thermal drifts or vibration. Beneficially, misalignment of the aberration corrector is easily and reliably compensated and alignment of a field of the aberration corrector with the optical axis is better controlled.

According to an embodiment, it is provided a first retainer 321 arranged to maintain the first field modulator in the first position. In an example, the first retainer 321 may be a removable retainer, a temporary retainer, a re-usable retainer and/or a multi-use retainer. In an example, the first retainer 321 may be a spring, a Belleville washer, a spring lock washer, a pin, a clip, a clamp, or a wedge. In an example, the first retainer 321 may be arranged against a surface of the first field modulator.

Accordingly, misalignment due to accidental movement and/or rotation of the field modulators which may be caused by vibration and/or thermal effects is minimized or avoided. Beneficially, alignment of the aberration corrector with the optical axis is reliably provided.

According to an embodiment, the first guide has a first extent (not shown), wherein when the first magnetic field modulator 220 is arranged at a first end portion of the first extent of the first guide, an overlap of the first magnetic field modulator 220 with the first magnetic pole 210 (when viewed) in a direction perpendicular to the axis 219 of the first magnetic pole 210 is non-zero. In an example, the first end portion of the first guide is adjacent to the first magnetic pole 210.

According to an embodiment, the first guide has a first extent (not shown), wherein when the first magnetic field modulator 220 is arranged at a second end portion of the first extent of the first guide, an overlap of the first magnetic field modulator 220 with the first air gap 230 (when viewed) in a direction perpendicular to the axis 219 of the first magnetic pole 210 is zero. In an example, the second end portion of the first guide is adjacent to the ring 240.

The first extent of the first guide may be understood as a dimension or length of the first guide in a direction parallel to the axis 219 of the first magnetic pole 210. In an example, an axis 429 of the first guide is substantially parallel to or coincident with the axis 219 of the first magnetic pole 210.

According to an embodiment, a dimension of the first guide in a direction parallel to the axis 219 of the first magnetic pole 210 is at least as long as a dimension of the first air gap 230 in a direction parallel to the axis 219 of the first magnetic pole 210.

According to an embodiment, the first guide is arranged and/or configured to support the first magnetic field modulator 220 in a first end position, in a second end position and in positions between the first end position and the second end position.

The first end position may be understood as a radially inward end position. The first end position may be understood as a position where an overlap of the first magnetic field modulator 220 with the first magnetic pole 210 (when viewed) in a direction perpendicular to the axis 219 of the first magnetic pole 210 is non-zero.

The first end position may be understood as a position where an intersect of the first magnetic field modulator 220 with the first magnetic pole 210 in a radial direction with respect to the axis 219 of the first magnetic pole 210 is non-zero.

The first end position may be understood as a position of the first magnetic field modulator 220 where the first magnetic pole 210 at least partially traverses or intersects with the first magnetic field modulator 220, when projecting the first magnetic pole 210 in a radial direction with respect to the axis 219 of the first magnetic pole 210 or when projecting the first magnetic pole 210 in a direction perpendicular to the axis 219 of the first magnetic pole 210.

Beneficially, an upper end of a range of magnetic coupling between the first magnetic pole 210 and the ring 240 is extended. Accordingly, the modulation range, including linear portion of the range, is increased. Accordingly, larger tolerances can be better compensated. Beneficially, misalignment of the aberration corrector is easily compensated.

The second end position may be understood as a radially outward end position. The second end position may be understood as a position where an overlap of the first magnetic field modulator 220 with the first magnetic pole 210 (when viewed) in a direction perpendicular to the axis 219 of the first magnetic pole 210 is less than the overlap of the first magnetic field modulator 220 with the first magnetic pole 210 when the first magnetic field modulator 220 is in the first end position.

Beneficially, a lower end of a range of magnetic coupling between the first magnetic pole 210 and the ring 240 is extended. Accordingly, the modulation range, including linear portion of the range, is increased. Accordingly, larger tolerances can be better compensated. Beneficially, misalignment of the aberration corrector is easily compensated.

The radial direction in the expressions 'radially inward' and 'radially outward' may be understood as a direction extending perpendicularly or radially from the optical axis 109, or extending parallel to the axis 219 of the first magnetic pole 210 (where 'radially inward' may be understood as towards a pole-head of the first magnetic pole 210, and 'radially outward' may be understood as away from a pole-head of the first magnetic pole 210).

In an example, the second end position may be understood as a position where an overlap of the first magnetic field modulator 220 with the first magnetic pole 210 (when viewed) in a direction perpendicular to the axis 219 of the first magnetic pole 210 is zero.

Accordingly, the modulation range, including linear portion of the range, is increased. Accordingly, larger tolerances can be better compensated. Beneficially, misalignment of the aberration corrector is easily compensated.

According to an embodiment, the first guide and the first magnetic field modulator 220 are configured such that the first position of the first magnetic field modulator 220 has a first position limit and a second position limit (not shown), the first position limit being separated from the second position limit by a length at least twice the length of the first air gap 230 in a direction parallel to the axis 219 of the first magnetic pole 210.

In an example, the first guide may be a linear bearing (not shown) arranged adjacent to the ring 240. In an example, the first magnetic field modulator 220 is a rod including a soft magnetic material and having a length at least twice the length of the first air gap 230. In another example, the first guide may be a threaded support (not shown) arranged within or adjacent to a housing of the aberration corrector 101. In an example, the first magnetic field modulator 220 is a screw of a soft magnetic material having a length at least twice the length of the first air gap 230.

In an example, the first position limit is separated from the second position limit by a length at least 3 times, at least 5 times or at least 10 times the length of the first air gap 230 in a direction parallel to the axis 219 of the first magnetic pole 210.

Accordingly, an extended range of correction is achieved. In particular, a linear range of behaviour is extended and the magnetic field can be modulated further. Beneficially, tolerances can be better compensated and the aberration corrector better aligned with the optical axis.

According to an embodiment which may be combined with other embodiments and examples described herein, the first magnetic field modulator 220 is arranged in a plane substantially parallel to a plane of the plurality of magnetic poles of the first multipole stage 103. In an example, the first magnetic field modulator 220 is arrangeable only in a plane substantially parallel to a plane of the plurality of magnetic poles of the first multipole stage 103.

In an example, the first magnetic field modulator 220 is arranged at a non-zero distance from the first magnetic pole 210, in a direction perpendicular to a plane of the ring 240. In an example, the first magnetic field modulator 220 is arranged above or below a plane of the ring 240.

The term 'parallel' may be understood as 'having a non-zero distance continuously in between'. The term 'parallel' may be understood as 'parallel and not coincident'.

Accordingly, a less sensitive magnetic field modulation effect of the magnetic field modulator is provided. Accordingly, a lower relative sensitivity of correction is possible. In particular, tolerances can be more precisely compensated. Beneficially, magnetic field imperfections are corrected or minimized. Beneficially, the multipole field of the aberration corrector is better aligned with the optical axis.

According to an aspect, there is provided a charged particle beam apparatus 707, having a sample stage 786, a charged particle source 780 adapted to generate a charged particle beam 782, and a charged particle beam manipulation system 784 having an aberration corrector 101.

According to an embodiment, the first position of the first magnetic field modulator 220 is (determined) based on a measured effect of a magnetic field of the first magnetic pole 210 at a location substantially coincident with the optical axis 109. In an example, the effect of the magnetic field is an image shift. In an example, the measured effect is a measured deflection sensitivity of the first deflection pole. In an example, the first magnetic pole 210 is driven while the further magnetic poles 211 are not driven. In an example, field imperfections are corrected or minimized when the first magnetic field modulator 220 is in the first position.

In an example, the first position is between the first end position and the second end position. In an example, the first position is a center position between the first end position and the second end position.

In a specific example, the first magnetic field modulator 220 is provided at an initial position. The further magnetic field modulators 221 may be provided at respective further initial positions. The first magnetic field modulator 220 may be re-positioned, e.g. based on the measured deflection field strength or measured deflection sensitivity, of the first magnetic pole 210. After adjustment, the first magnetic field modulator 220 may be at the first position. When the first magnetic field modulator 220 is in the first position, field imperfections in the field of the first multipole stage 103 are corrected or minimized.

In an example, the first position of the first magnetic field modulator 220 and positions of the further magnetic field modulators 220 are such that the respective effects of respective magnetic fields of respective magnetic poles are equal. In an example, the first position of the first magnetic pole 210 and positions of the further magnetic poles 211 are such that the deflection sensitivity of the first magnetic pole 210 is equal to the deflection sensitivity of each of the further magnetic poles 211.

Accordingly, after assembling a new column, tolerances are easily compensated by the magnetic field modulators. Beneficially, misalignment of the aberration corrector is easily compensated and field imperfections are corrected or minimized.

Figure 8:
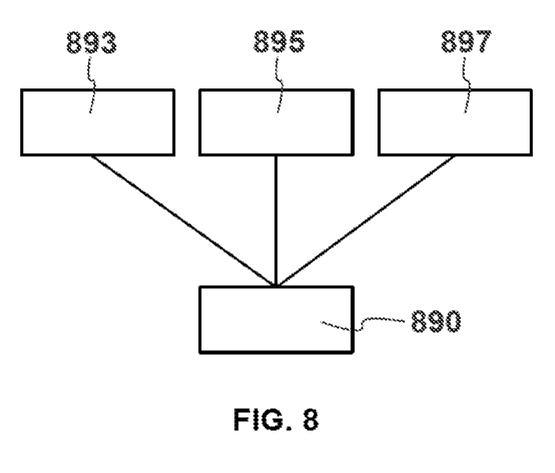
FIG. 8 is a flow diagram illustrating a method of aligning a magnetic field of an aberration corrector according to embodiments described herein.

According to an aspect, there is provided a method of aligning a magnetic field of an aberration corrector with an optical axis, the method including positioning the first magnetic field modulator in a first position 890, the first position being one of a plurality of positions along a first axis substantially parallel to or coincident with the axis of the first magnetic pole.

Accordingly, by adjusting the position of the magnetic field modulator, a magnetic reluctance of the magnetic circuit of the magnetic pole is adjusted. Accordingly, the magnetic flux and thus magnetic field of the magnetic pole is modulated. Accordingly, the deflection sensitivity of the magnetic poles can be made substantially equal and the field of the multipole stage aligned to the optical axis. Accordingly, field imperfections are corrected or minimized.

In this way, the magnetic multipole field of the aberration corrector can be adjusted. Beneficially, a variety of tolerances that causes misalignment of the aberration corrector is compensated and the aberration corrector aligned with the optical axis.

According to an embodiment, a first deflection sensitivity of the first magnetic pole is measured and a second deflection sensitivity of at least one of the further magnetic poles is measured 893, and the first magnetic field modulator is positioned in the first position 890 such that the first sensitivity and second sensitivity are substantially equal.

According to an embodiment, the first position of the first magnetic field modulator 220 is (determined) based on a measured magnetic field of the first magnetic pole 210. The magnetic field may be measured at a location substantially at the optical axis 109. In an example, the magnetic field is measured with a rotating magnetic sensor. In an example, the first magnetic pole 210 is driven while the further magnetic poles 211 are not driven. In an example, field imperfections are corrected or minimized when the first magnetic field modulator 220 is in the first position.

In an example, an excitation is provided to the first magnetic pole or the first magnetic pole 210 is driven. In an example, the further magnetic poles 211 of the plurality of magnetic poles of the first multipole stage 103 is provided no excitation or is not driven while the first magnetic pole 210 is provided the excitation or is driven. Accordingly, the first magnetic pole produces a magnetic field.

In an example, the magnetic field of the first magnetic pole 210 is measured with a rotating magnetic field sensor. In an example, the rotating magnetic field sensor is arranged a location substantially at the optical axis. In an example, the first position of the first magnetic field modulator 220 is (determined) based on the measured magnetic field of the first magnetic pole 210.

In an example, it is disclosed to adjust or to determine the first position of the first magnetic field modulator 220 based on the measured magnetic field of the first magnetic pole 210. In an example, when the first magnetic field modulator 220 is in the first position, the measured magnetic field of the first magnetic pole 210 is equal to at least one of the further magnetic poles 211, or to all of the further magnetic poles 211.

In an example, a rotating magnetic field sensor is used to measure the magnetic field created by each individually excited magnetic pole. In an example, a magnetic field sensor is used to measure the magnetic field created by the individually excited first magnetic pole and by the individually excited further magnetic poles.

In an example, the first magnetic field modulator and further magnetic field modulators are positioned such that the field strength of the first magnetic pole and further magnetic poles are substantially equal.

According to an embodiment, a magnetic field is measured 895, with a rotating magnetic field sensor at a location substantially at the optical axis, parasitic multipole fields are identified based on the measured magnetic field, and the first magnetic field modulator is positioned in the first position 890 such that the parasitic multipole fields are minimized.

According to an embodiment, an excitation of the aberration corrector is wobbled 897, and the first magnetic field modulator is positioned in the first position 890 such that image shifts during the wobbling are minimized. The term 'wobble' may be understood as to 'periodically change around a mean value'.

According to an embodiment, the aberration corrector is commissioned in a charged particle beam apparatus, and positioning of the first magnetic field modulator in the first position 890 is performed during the commissioning.

Some further illustrative examples are as follows.

In an illustrative example, the first magnetic field modulator 220 may be a screw or a rod of a soft magnetic material. In an example, the first magnetic field modulator 220 is arranged within a portion of the ring 240 where the first magnetic pole 210 approaches the ring 240. In an example, the first magnetic field modulator 220 is a screw held in place by a spring. In an example, a clamp fixes the first magnetic field modulator 220 in position.

In an illustrative example, the first magnetic field modulator 220 includes an external screw thread and a ratchet surface. In an example, there is provided a spring loaded pawl acting on the ratchet surface of the first magnetic field modulator 220. Accordingly, pre-determined positions of the first magnetic field modulator 220 is provided.

In an illustrative example, the first magnetic pole 210 includes a rod portion and a pole head portion, each having a screw thread such that the rod portion can be screwed into and unscrewed from the pole head portion. Accordingly, a size of the first air gap 230 can be changed. In an example, at least one shim of pre-determined thickness is provided in the first air gap 230 to determine a size of the first air gap 230.

In an illustrative example, the first magnetic field modulator 220 is actuated. In an example, a piezoelectric driver is coupled to the first magnetic field modulator 220. In an example, an actuator is arranged in the ring 240, for example in a hole in the ring 240, such as radially outward of the first magnetic pole 210.

In an illustrative example, a linear motion range of the first field modulator is a value between 0.1 mm to 10 mm. In an example, a positioning precision of the first field modulator is at least 0.1 mm or at least 0.01 mm.

In an illustrative example, the first magnetic field modulator 220 is arranged in an off-axial location relative to the rod portion of the first magnetic pole 210. In an example, the first magnetic field modulator 220 is arranged below the rod portion and/or below the first excitation coil 350 of the first magnetic pole 210. The rod portion of the magnetic pole may be understood as the pole piece portion of the magnetic pole. Accordingly, when the position of the first magnetic field modulator 220, e.g. axial position, is varied, more or less magnetic flux is transferred between the first magnetic pole 210 and the ring 240, thereby influencing the magnetic field on the optical axis 109.

In an illustrative example, a deflection sensitivity of each magnetic pole can be measured, e.g. in a scanning electron microscope, e.g. by observing an image shift when applying a small current on only one of the magnetic poles at a time. For this purpose, a serial connection of the excitation coils can be broken and each excitation coil is excited individually. In an example, a position of each magnetic field modulator can be adjusted such that an equal deflection sensitivity for each magnetic pole is observed. In an example, this is an iterative adjustment.

Embodiments described herein may be done after assembling a new column. Once the tolerances are compensated by the magnetic field modulators, the magnetic flux remains constant except for transient effects like thermal or magnetic drifts, which can be understood to act equally on all poles.

In an illustrative example, an alignment mode and an operation mode of the magnetic poles are possible. In an example, in an alignment mode, excitation coils of the plurality of magnetic poles are excited individually. In an example, in an operation mode, a current source simultaneously drives the excitation coils of the plurality of magnetic poles.

In an illustrative example, before assembling the full column, the magnetic field of each multipole stage is detected with a rotating magnetic field sensor in close proximity to the optical axis 109 and correlated to the rotation angle of the detector with respect to the multipole. In an example, from a continuous Fourier analysis of the field vs. angle function, parasitic multipole fields, e.g. dipole, hexapole and octupole, can be identified and compensated with the magnetic field modulators. In this example, there is no need for individual excitation.

In an illustrative example, the plurality of excitation coils of the plurality of magnetic poles are connected in series in an operation mode. In an example, the magnetic and electric multipole excitations are wobbled and the magnetic field modulators are adjusted such that multipole effects and image shifts are minimized both for magnetic and electric excitations. Accordingly, the center of the electric and magnetic multipoles are aligned.

It may be understood that a magnetic circuit can include different elements of soft-magnetic material, possibly but not necessarily of the same type of soft magnetic material. It may be understood that the magnetic flux of a pole at the optical axis 109, or on-axial flux, is strongly determined by the magnetic reluctance between the pole and ring 240. Accordingly, it may be understood that magnetic field adjustment can be made by introducing a magnetic field modulator, e.g. a screw of soft magnetic material, in the vicinity of the ring 240, e.g. at the location where the pole approaches the ring 240.

Accordingly, by varying the magnetic reluctance between the pole and the ring 240, the magnetic flux of the pole can also be varied. The larger the magnetic reluctance, the smaller the magnetic flux. Vice versa, the smaller the magnetic reluctance, the larger the magnetic flux. Accordingly, by controlling the magnetic reluctance, the magnetic field at the optical axis 109 by each pole can be independently adjusted.

That is, a mechanical or electro-mechanical means can provide fine adjustment of the magnetic reluctance between a pole and ring 240. For example, a magnetic field modulator can provide fine adjustment of the magnetic reluctance. The magnetic field modulator may be a variable or adjustable field clamp.

Beneficially, the aberration correction can be adjusted to provide precise magnetic flux distribution at an optical axis. That is, the aberration corrector provides optimal correction. More particularly, an aberration corrector with improved performance is provided.

Yet further illustrative examples are as follows. The examples relate to balancing resistors for magnetic multipoles.

For a multipole corrector (Cc-Cs) with superposed electric and magnetic quadrupole fields, a single current source may be used to drive all the excitation coils, which are connected in series. The excitation coils may have predetermined winding numbers in order to create a quadrupole field. Accordingly, effects of current noise may be minimized, such as dipole noise, which would result from uncorrelated current fluctuations in the individual excitation coils. Connecting the excitation coils in series correlates the noise in the individual excitation coils and therefore only results in "quadrupole noise".

It may be understood that mechanical inaccuracies in the multipole, material inhomogeneities leading to magnetic flux variations and winding tolerances, can result in undesired parasitic multipole fields, when all the excitation coils are connected in series.

Balancing resistors may be used for deflection coils and magnetic octupoles, which can be used to produce quadrupole fields for astigmatism correction. In particular, balancing resistors may be used in connection with a multipole aberration corrector 101. Presently, aberration correctors are manufactured to the highest accuracy to prevent unwanted residual aberrations. It is possible to adjust a radial gap around the magnetic poles to control the magnetic flux inhomogeneities.

In an illustrative example, one or more parallel adjustable resistors (potentiometers) can be added to each individual excitation coil which can be used to adjust the current flow through the excitation coil within a particular range. The parallel resistor $R_p$ may introduce a voltage noise that will lead to a current fluctuation in the excitation coil. For example, a current fluctuation may be described as follows: Current fluctuation $$\Delta I_{RMS} = \sqrt{4k_B T \frac{\Delta f}{R_p}}.$$

In an illustrative example, where temperature, T=300 K, parallel resistor, $R_p$=5 Ohms, and frequency bandwidth, $\Delta f$=10 kHz, there can be around 5 nA of current noise in each of the excitation coils. The term $k_B$ is Boltzmann constant.

It may be understood that even if the mechanical tolerances are very tight and everything within the corrector is produced to the best accuracy, residual aberrations related to inhomogeneities and inaccuracies can remain. Such residual aberrations may be corrected by applying correction voltages to the poles or having auxiliary windings for magnetic correction fields.

However, large correction voltages that meet the noise requirements for the corrector are not easy. Further, auxiliary coils require further additional power supplies that add to the noise of the system, and more parts that need to be manufactured.

Accordingly, balancing resistors can be used for deflection coils and/or magnetic multipoles, in particular in a design of an aberration-corrected column.

Figure 6:
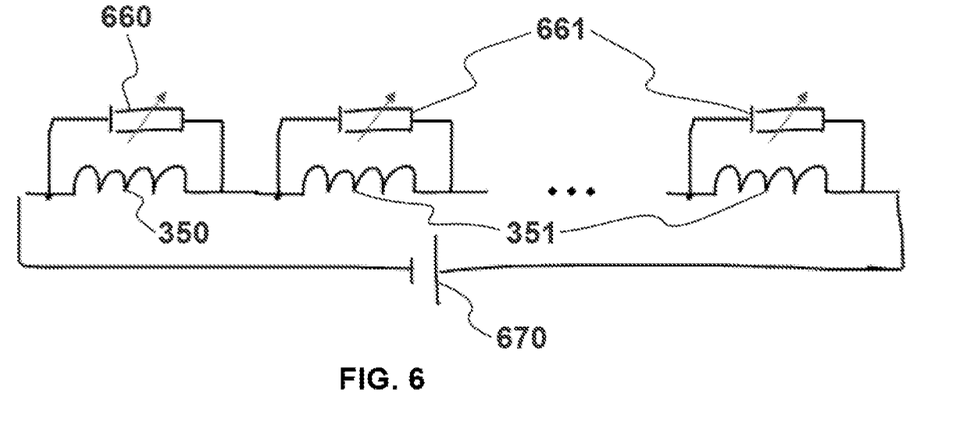
FIG. 6 is a schematic illustration of balancing resistors according to embodiments described herein.

According to an illustrative example, there is provided a first excitation coil 350 of a first magnetic pole 210, and a first adjustable resistor 660 connected in parallel with the first excitation coil 350. According to an illustrative example, the first adjustable resistor 660 is a balancing resistor.

According to an illustrative example, the first adjustable resistor 660 is adjusted to adjust the current through the first excitation coil 350. Accordingly, when the first adjustable resistor 660 is adjusted, the excitation changes such that more or less magnetic flux is transferred between the first magnetic pole 210 and the ring 240, thereby influencing the magnetic field on the optical axis 109.

Accordingly, the deflection sensitivity of the poles can be made substantially equal and the field of the multipole stage aligned to the optical axis. Accordingly, field imperfections are corrected or minimized.

According to an illustrative example, each of the further excitation coils 351 of the further magnetic poles 211 are provided with further adjustable resistors 661. Each of the further adjustable resistors 661 are connected in parallel with respective each of the further excitation coils 351.

Figure 1:
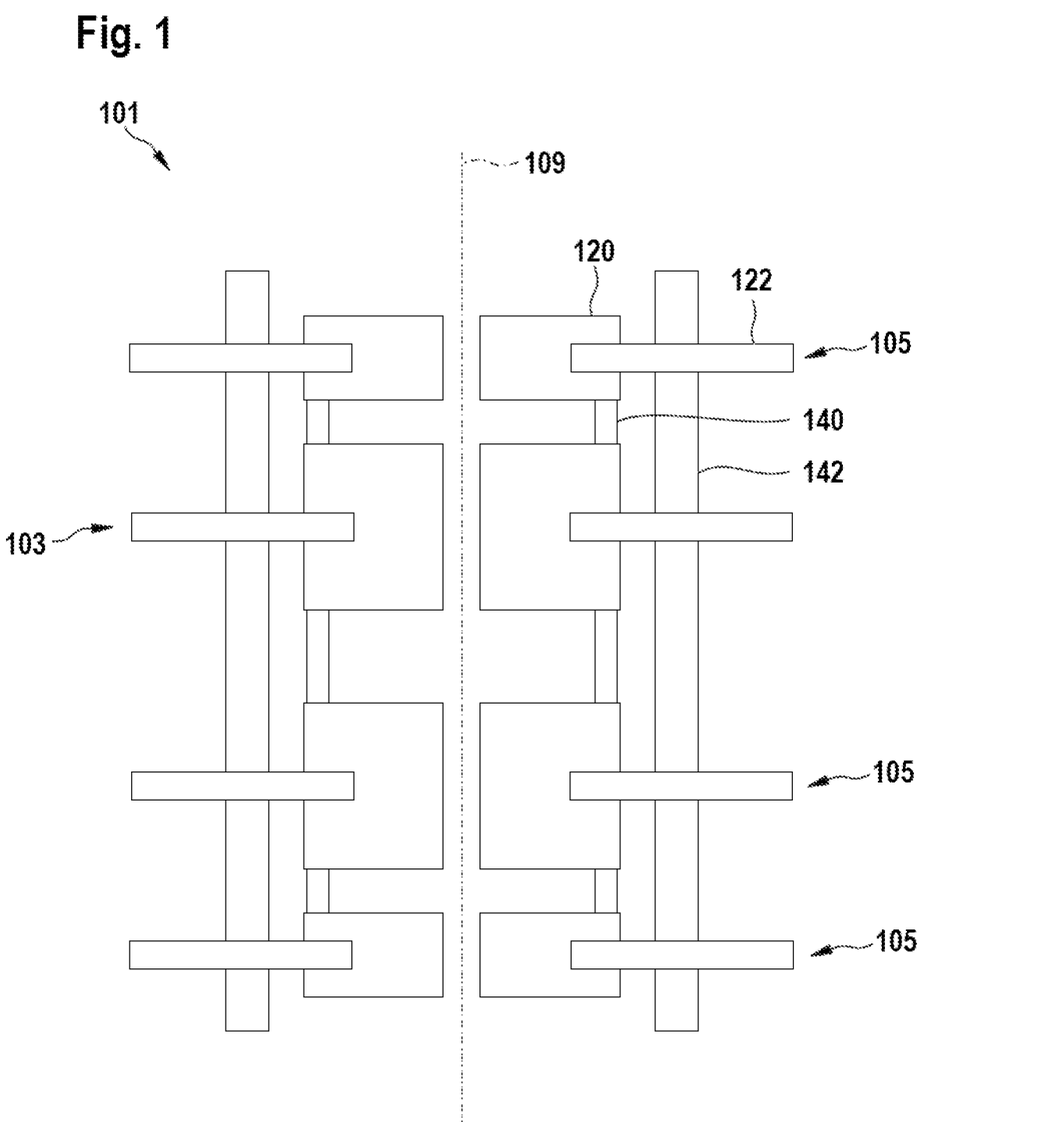
FIG. 1 is a section view of an aberration corrector according to embodiments described herein.

Referring now to FIG. 1, a section view of an aberration corrector is shown. The aberration corrector 101 is shown relative to an optical axis 109. The aberration corrector 101 is shown to include a first multipole stage 103. The aberration corrector 101 is shown to include further multipole stages 105. In an example, the first multipole stage 103 is a multipole stage having a plurality of magnetic poles. In an example, the further multipole stages 105 include multipole stages having electrostatic and/or magnetic poles.

Figure 2:
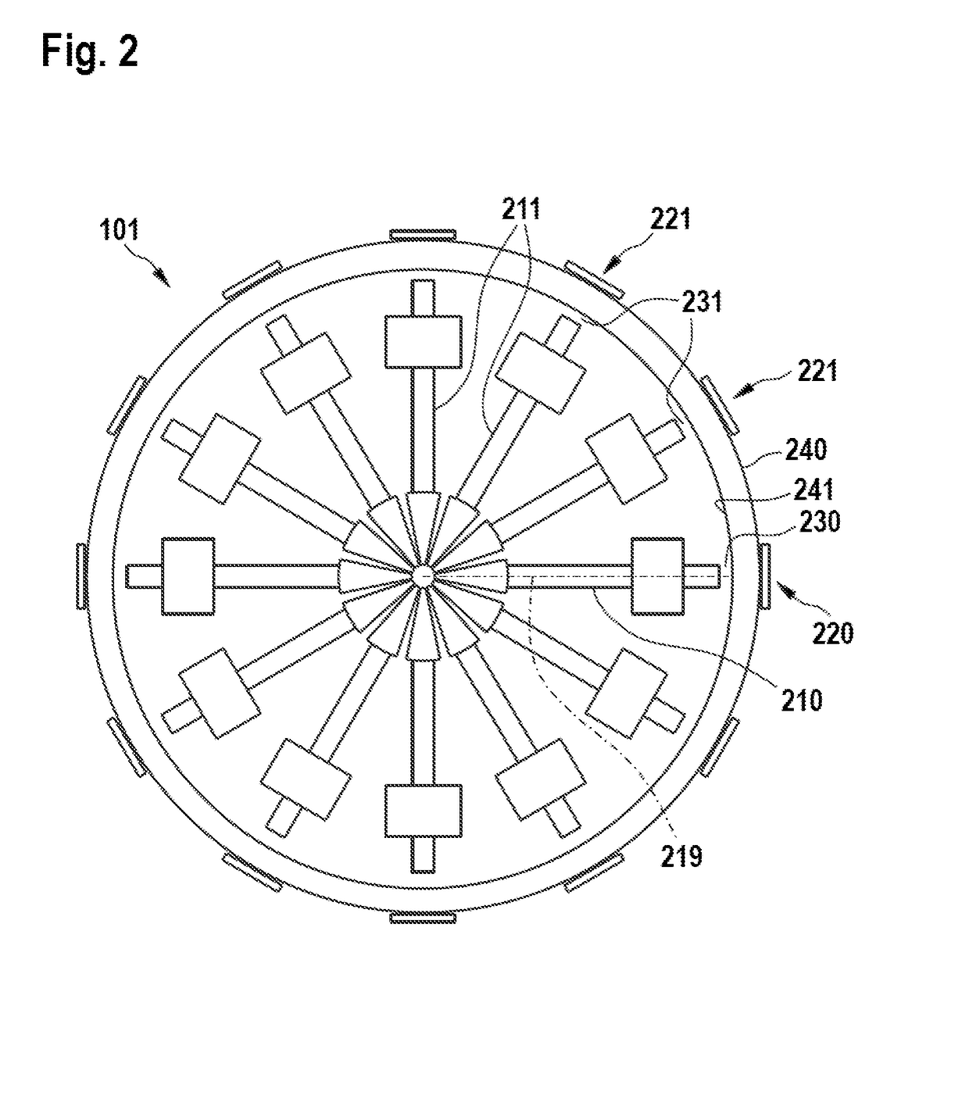
FIG. 2 is a section view of an aberration corrector according to embodiments described herein.

Referring now to FIG. 2, a section view of an aberration corrector is shown. As shown, the aberration corrector 101 has a first magnetic pole 210, further magnetic poles 211, and a ring 240. Also shown is a first magnetic field modulator 220 and further magnetic field modulators 221. As may be seen, a first air gap 230 separates the first magnetic pole 210 and the ring 240, while further air gaps 231 separate the further magnetic poles 211 and the ring 240. Also seen is an axis 219 of the first magnetic pole 210, and an inner ring surface 241.

Figure 3:
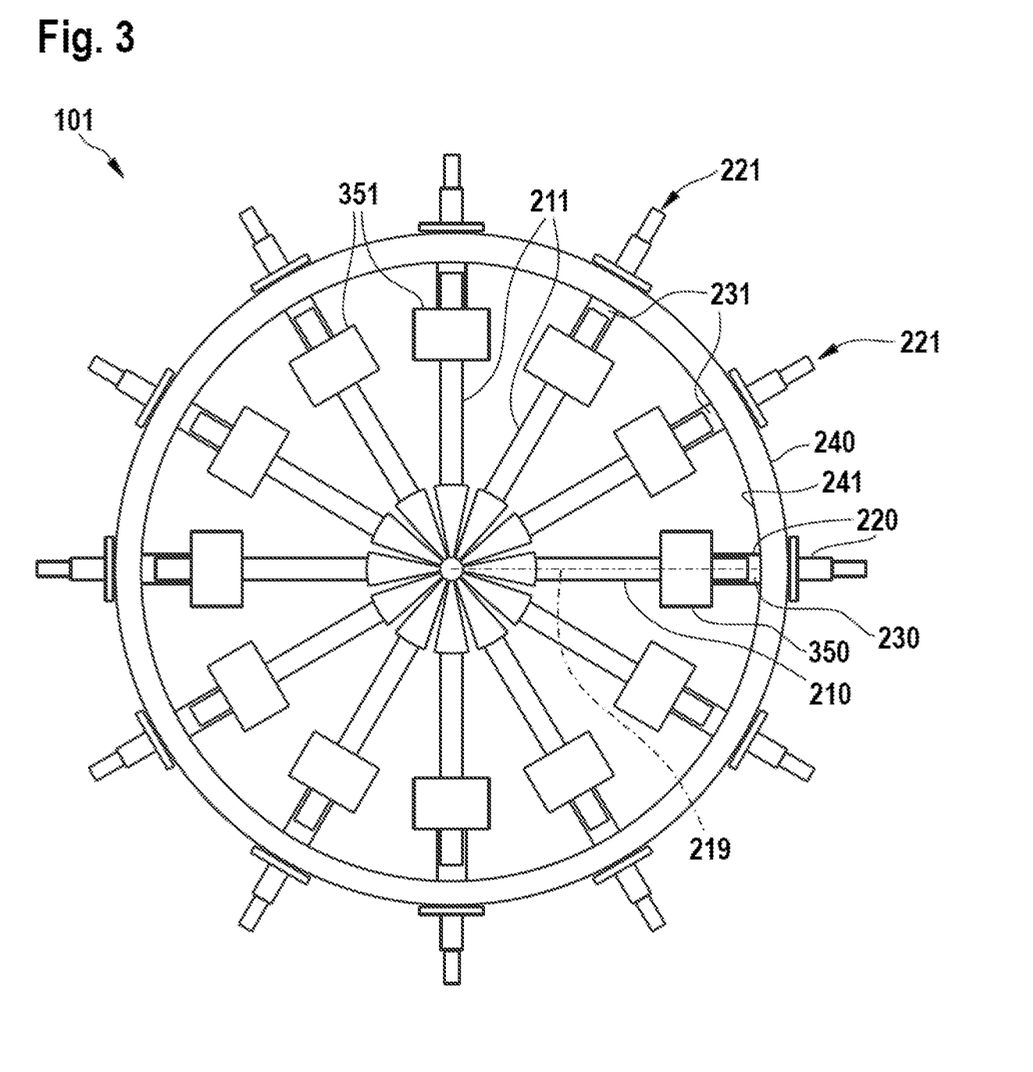
FIG. 3 is a section view of an aberration corrector according to embodiments described herein.

Referring now to FIG. 3, a section view of an aberration corrector is shown. As in FIG. 2, first magnetic pole 210, further magnetic poles 211, first magnetic field modulator 220, further magnetic field modulators 221 and ring 240 are shown. Additionally shown are first excitation coil 350 and further excitation coils 351.

Figure 4:
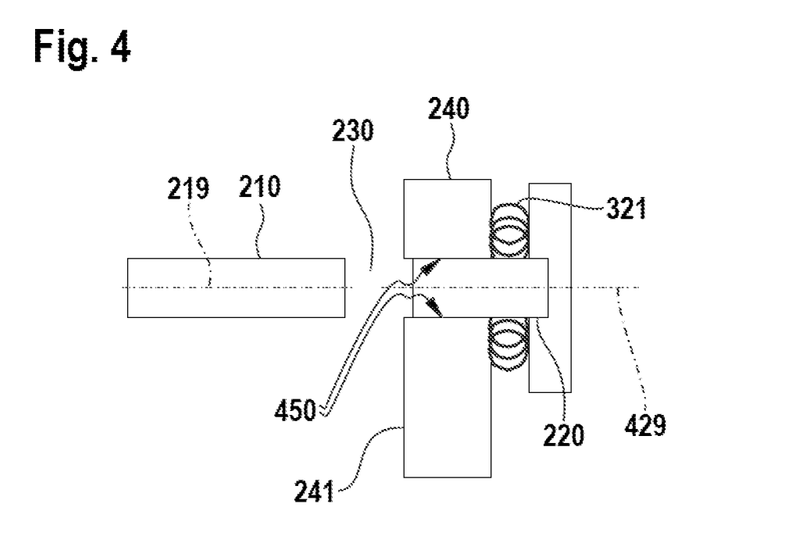
FIG. 4 is an enlarged view of a magnetic field modulator according to embodiments described herein.

Referring now to FIG. 4, an enlarged view of a magnetic field modulator is shown. Shown are first magnetic pole 210, first magnetic field modulator 220, first air gap 230, ring 240. As seen, first magnetic field modulator 220 may be positioned adjacent to the first air gap 230, and at an inner ring surface 241 of the ring 240, or radially outward of the inner ring surface 241. As seen, the first magnetic field modulator 220 may be positioned in a position along an axis extending from an axis of the first magnetic pole 210.

In the example shown, the first magnetic field modulator 220 may be a screw or have a screw mechanism. The first magnetic field modulator 220 is shown with a first retainer 321, which is illustrated as a spring.

The first magnetic field modulator 220 is supported by a first guide 450, which in the illustration (see FIG. 4 or FIG. 5) is a part of the ring 240 or a part within the ring 240. As shown, the first guide 450 constrains the first magnetic field modulator 220 to positions along a first axis 429 coincident with the axis 219 of the first magnetic pole 210. As seen, the first magnetic field modulator 220 can be adjusted along the first axis 429.

The first axis 429 may be understood as a direction or a length. Alternatively or additionally, the first axis 429 may be understood as an axis of the first guide 450.

The first magnetic field modulator 220 may be positioned radially outward of the inner ring surface 241 along an axis 219 of the first magnetic pole 210.

Figure 5:
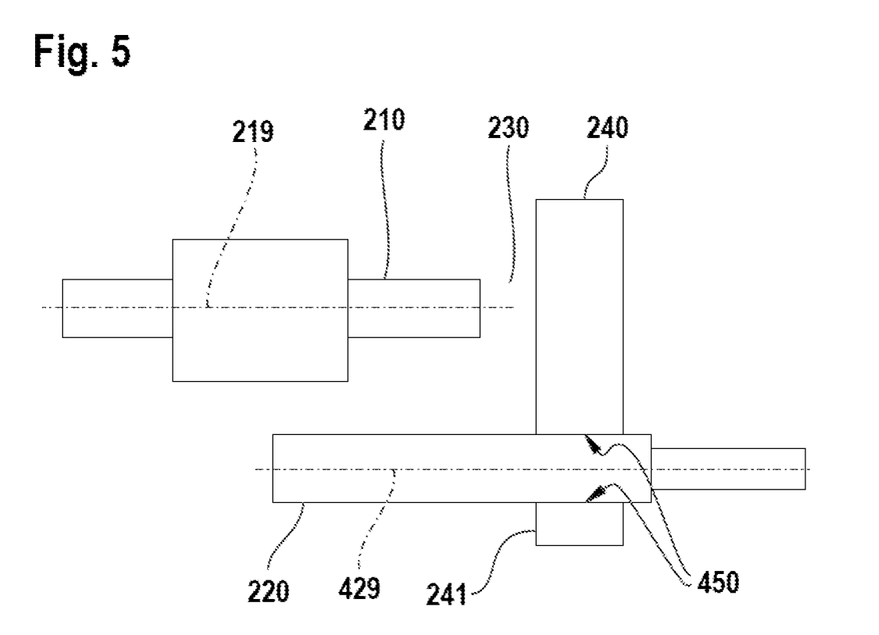
FIG. 5 is an enlarged view of a magnetic field modulator according to embodiments described herein.

Referring now to FIG. 5, an enlarged view of a magnetic field modulator is shown. As in FIG. 4, first magnetic pole 210, first magnetic field modulator 220, first air gap 230, ring 240 are shown. Illustrated is the first magnetic field modulator 220 positioned adjacent to the first air gap 230, and below the first magnetic pole 210, i.e. in a plane parallel to a plane of the plurality of magnetic poles.

Referring now to FIG. 6, a schematic illustration of balancing resistors is shown. As shown, the first adjustable resistor 660 is connected in parallel to the first excitation coil 350. Also shown are further adjustable resistors 661 connected in parallel with respective further excitation coils 351. Further shown is a current source 670 driving the first excitation coil 350 of the first magnetic pole 210 and further excitation coils 351 of respective further magnetic poles 211. The current source 670 is shown connected in series with the first excitation coil 350 and further excitation coils 351.

Figure 7:
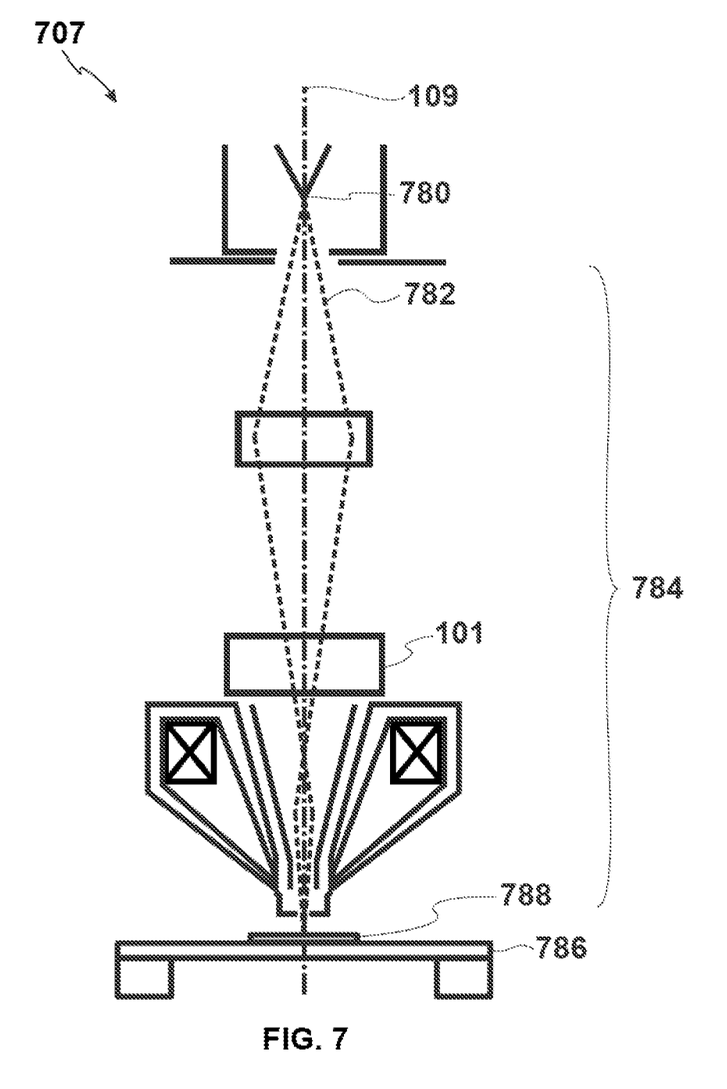
FIG. 7 is a schematic illustration of a charged particle beam apparatus according to embodiments described herein.

Referring now to FIG. 7, a schematic illustration of a charged particle beam apparatus is shown. As shown, the charged particle beam apparatus 707 includes a charged particle source 780, sample stage 786 and a charged particle beam manipulation system 784 including an aberration corrector 101. As illustrated, the charged particle source 780 is adapted to generate a charged particle beam 782. As seen, the sample stage 786 is adapted to support a sample 788. Illustrated is the optical axis 109.

Referring now to FIG. 8, a flow diagram illustrating a method of aligning a magnetic field of an aberration corrector is shown. The method is illustrated to include at least one of measuring a first deflection sensitivity and measuring a second deflection sensitivity 893, measuring a magnetic field 895, wobbling an excitation of an aberration corrector 897, and positioning a first magnetic field modulator in a first position 890.

Figure 9:
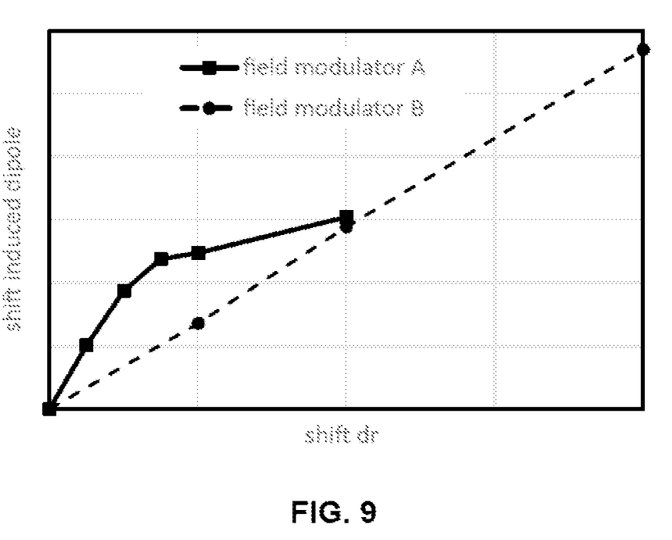
FIG. 9 is a plot illustrating modelled effects of different magnetic field modulators according to embodiments described herein.

Referring now to FIG. 9, a plot schematically illustrating modelled effects of different magnetic field modulators is shown. The plot shows relative change in dipole magnitude (ordinate) vs. relative change in position of magnetic field modulator (abscissa). The solid line labelled 'field modulator A' shows a relative change in dipole magnitude achieved by a magnetic field modulator, wherein the axis of the magnetic field modulator is coincident with the axis of the magnetic pole (the magnetic field modulator is in the plane of the plurality of magnetic poles). The dashed line labelled 'field modulator B' shows a relative change in dipole magnitude achieved by a magnetic field modulator positioned above or below the plane of the plurality of the magnetic poles (illustrated in FIG. 5). It is shown that field modulator B achieves larger dipole correction values and has a more linear behaviour than field modulator A.

The optical axis 109 may be understood to be the optical axis 109 of a charged particle beam apparatus 707.

The expression 'substantially perpendicular' may be understood as an angle within 20 degrees, within 10 degrees or within 5 degrees of perpendicularity. The expression 'substantially parallel' may be understood as an angle of less than 20 degrees, less than 10 degrees or less than 5 degrees.

It may be understood that embodiments of the first magnetic field modulator 220 are also disclosed in relation to one or more or all of the further magnetic field modulators 221. It may be further understood that embodiments of the first magnetic pole 210 are also disclosed in relation to one or more or all of the further magnetic poles 211. It may be further understood that embodiments of the first multipole stage 103 are also disclosed in relation to one or more or all of the further multipole stages 105.

While the foregoing is directed to specific embodiments, other and further embodiments may be devised without departing from the basic scope thereof, and the scope thereof is determined by the claims that follow.

The invention claimed is:

1. An aberration corrector, comprising:
a plurality of magnetic poles including a first magnetic pole and further magnetic poles,
a ring that magnetically connects the plurality of magnetic poles with one another, the ring having a constant spacing to at least the first magnetic pole,
a plurality of magnetic field modulators including a first magnetic field modulator and further magnetic field modulators, and
a plurality of guides including a first guide and further guides;
wherein the first magnetic field modulator comprises a soft magnetic material,
wherein the first magnetic field modulator is disposed in a first position, the first position being at least one of the following: adjacent to a first air gap separating the first magnetic pole and the ring, at an inner ring surface, radially outward of the inner ring surface along an axis of the first magnetic pole, and
wherein the first guide constrains the first magnetic field modulator to positions along a first axis substantially parallel to or coincident with the axis of the first magnetic pole.

2. The aberration corrector according to claim 1, further comprising a current source adapted to drive the first magnetic pole and the further magnetic poles.

3. The aberration corrector according to claim 1, further comprising a retainer arranged to maintain the first field modulator in the first position, or wherein the first guide includes a first actuator.

4. The aberration corrector according to claim 1, wherein the first position of the first magnetic field modulator is based on a measured magnetic field at a location substantially at an optical axis.

5. The aberration corrector according to claim 1, wherein the first magnetic pole, the first magnetic field modulator and the ring are supported such that the first position of the first magnetic field modulator is independent of a first distance between the first magnetic pole and the ring.

6. The aberration corrector according to claim 1, wherein the first magnetic field modulator is disposed in a plane substantially parallel to a plane of the plurality of magnetic poles.

7. The aberration corrector according to claim 1, wherein the first guide is configured to support the first magnetic field modulator in a first end position and a second end position, wherein, in the first end position, an overlap of the first magnetic field modulator with the first magnetic pole, when viewed in a direction perpendicular to the axis of the first magnetic pole, is non-zero.

8. The aberration corrector according to claim 1, wherein the first guide is adapted to support the first magnetic field modulator in positions along a length at least as long as the first air gap, the length being in a direction parallel to or coincident with the axis of the first magnetic pole.

9. A charged particle beam apparatus, comprising:
a sample stage,
a charged particle source adapted to generate a charged particle beam, and
a charged particle beam manipulation system including the aberration corrector according to claim 1.

10. The charged particle beam apparatus according to claim 9, wherein the first position of the first magnetic field modulator is based on a measured effect of a magnetic field or measured magnetic field of the first magnetic pole at an optical axis.

11. An aberration corrector, comprising:
a plurality of magnetic poles including a first magnetic pole and further magnetic poles,
a ring that magnetically connects the plurality of magnetic poles with one another, the ring having a constant spacing to at least the first magnetic pole,
a plurality of magnetic field modulators including a first magnetic field modulator and further magnetic field modulators, and
a plurality of guides including a first guide and further guides;
wherein the first magnetic field modulator comprises a soft magnetic material,
wherein the first magnetic field modulator is disposed in a first position, and
wherein the first guide constrains the first magnetic field modulator to positions along a first axis substantially parallel to or coincident with an axis of the first magnetic pole.

12. The aberration corrector according to claim 11, wherein the first magnetic field modulator is disposed in a plane substantially parallel to a plane of the plurality of magnetic poles.

13. The aberration corrector according to claim 11, wherein the first guide is configured to support the first magnetic field modulator in a first end position and a second end position, wherein, in the first end position, an intersect of the first magnetic field modulator with the first magnetic pole in a radial direction with respect to the axis of the first magnetic pole is non-zero.

14. The aberration corrector according to claim 11, wherein the first guide is configured to support the first magnetic field modulator in a first end position and a second end position, and wherein, in the first end position, an overlap of the first magnetic field modulator with the first magnetic pole, when viewed in a direction perpendicular to the axis of the first magnetic pole, is non-zero.

15. A method of aligning a magnetic field of an aberration corrector with an optical axis, the aberration corrector including:
a plurality of magnetic poles including a first magnetic pole and further magnetic poles,
a ring that magnetically connects the plurality of magnetic poles with one another, the ring having a constant spacing to at least the first magnetic pole; and,
a plurality of magnetic field modulators including a first magnetic field modulator and further magnetic field modulators, and
a plurality of guides including a first guide and further guides;
wherein the first magnetic field modulator comprises a soft magnetic material, and
wherein the first magnetic field modulator is disposed in a first position, the first position being one of the following:

adjacent to a first air gap separating the first magnetic pole and the ring, or at an inner ring surface or radially outward of the inner ring surface along an axis of the first magnetic pole, the method comprising:
positioning the first magnetic field modulator in a first position, the first position being one of a plurality of positions along a first axis substantially parallel to or coincident with the axis of the first magnetic pole.

16. The method according to claim 15, further comprising measuring a first deflection sensitivity of the first magnetic pole, measuring a second deflection sensitivity of at least one of the further magnetic poles, and positioning the first magnetic field modulator in the first position such that the first sensitivity and the second sensitivity are substantially equal.

17. The method according to claim 15, further comprising measuring a magnetic field, with a rotating magnetic field sensor at a position substantially coincident with the optical axis, identifying parasitic multipole fields based on the measured magnetic field, and positioning the first magnetic field modulator in the first position such that the parasitic multipole fields are minimized.

18. The method according to claim 15, further comprising driving the first magnetic pole, and measuring, with a magnetic field sensor, a magnetic field of the first magnetic pole, wherein when the first magnetic field modulator is in the first position, the measured magnetic field of the first magnetic pole is equal to at least one of the further magnetic poles, or to all of the further magnetic poles.

19. The method according to claim 15, further comprising wobbling an excitation of the aberration corrector, and positioning the first magnetic field modulator in the first position such that image shifts during the wobbling are minimized.

20. The method according to claim 15, further comprising commissioning the aberration corrector in a charged particle column, wherein positioning the first magnetic field modulator in the first position is performed during the commissioning.

* * * * *